United States Patent
Kempema et al.

(10) Patent No.: US 12,405,312 B2
(45) Date of Patent: Sep. 2, 2025

(54) TRACTION BATTERY CONTROLLER OPERABLE TO CONTROL BATTERY BASED ON ADAPTIVE SAMPLED ELECTROCHEMICAL IMPEDANCE SPECTROSCOPY BATTERY MEASUREMENTS

(71) Applicant: Ford Global Technologies, LLC, Dearborn, MI (US)

(72) Inventors: Nathan Kempema, Grosse Pointe Farms, MI (US); David Bilby, Royal Oak, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 185 days.

(21) Appl. No.: 18/474,357

(22) Filed: Sep. 26, 2023

(65) Prior Publication Data

US 2025/0102586 A1    Mar. 27, 2025

(51) Int. Cl.
*G01R 31/389*    (2019.01)
*B60L 58/12*    (2019.01)
*G01R 31/367*    (2019.01)

(52) U.S. Cl.
CPC ............ *G01R 31/389* (2019.01); *B60L 58/12* (2019.02); *G01R 31/367* (2019.01); *B60L 2240/547* (2013.01)

(58) Field of Classification Search
None
See application file for complete search history.

(56) References Cited

U.S. PATENT DOCUMENTS

| | | |
|---|---|---|
| 11,161,428 B2 | 11/2021 | Wang et al. |
| 2003/0173976 A1 | 9/2003 | Wiegand et al. |
| 2004/0073390 A1 | 4/2004 | Wagner et al. |
| 2009/0001992 A1* | 1/2009 | Tsuchiya ............... G01R 31/367 324/426 |
| 2015/0145520 A1* | 5/2015 | Kain ..................... H02J 7/0016 324/430 |
| 2015/0197158 A1* | 7/2015 | Lee ......................... B60L 58/15 701/22 |
| 2015/0301121 A1* | 10/2015 | Park ..................... G01R 31/392 324/426 |

(Continued)

FOREIGN PATENT DOCUMENTS

| | | |
|---|---|---|
| CN | 114325403 A | 4/2022 |
| CN | 114487846 A | 5/2022 |

(Continued)

*Primary Examiner* — Jas A Sanghera
(74) *Attorney, Agent, or Firm* — David B. Kelley; Brooks Kushman P.C.

(57) ABSTRACT

A system, such as an electrified vehicle, includes a battery, such as a traction battery. The controller controls the battery based on adaptive sampled electrochemical impedance spectroscopy (EIS) measurements of the battery. The controller may perform the adaptive sampled EIS measurements. The controller may use the adaptive sampled EIS measurements to identify values of parameters of a model, such as an equivalent circuit model (ECM), of the battery. The controller may use the model, with the identified values of the parameters, to detect an internal state of the battery whereby the controller detects the internal state of the battery based on the adaptive sampled EIS measurements.

20 Claims, 6 Drawing Sheets

(56) References Cited

U.S. PATENT DOCUMENTS

| | | |
|---|---|---|
| 2017/0219660 A1 | 8/2017 | Christensen et al. |
| 2019/0064284 A1 | 2/2019 | Christophersen et al. |
| 2020/0300796 A1 | 9/2020 | Gilbert et al. |
| 2023/0400526 A1* | 12/2023 | Kanai ................. G01R 31/392 |
| 2024/0085485 A1* | 3/2024 | Roemersperger .... G01R 31/367 |

FOREIGN PATENT DOCUMENTS

| | | |
|---|---|---|
| DE | 112020000969 T5 | 12/2021 |
| EP | 1357390 A1 | 10/2003 |
| WO | 2016012922 A1 | 1/2016 |

* cited by examiner

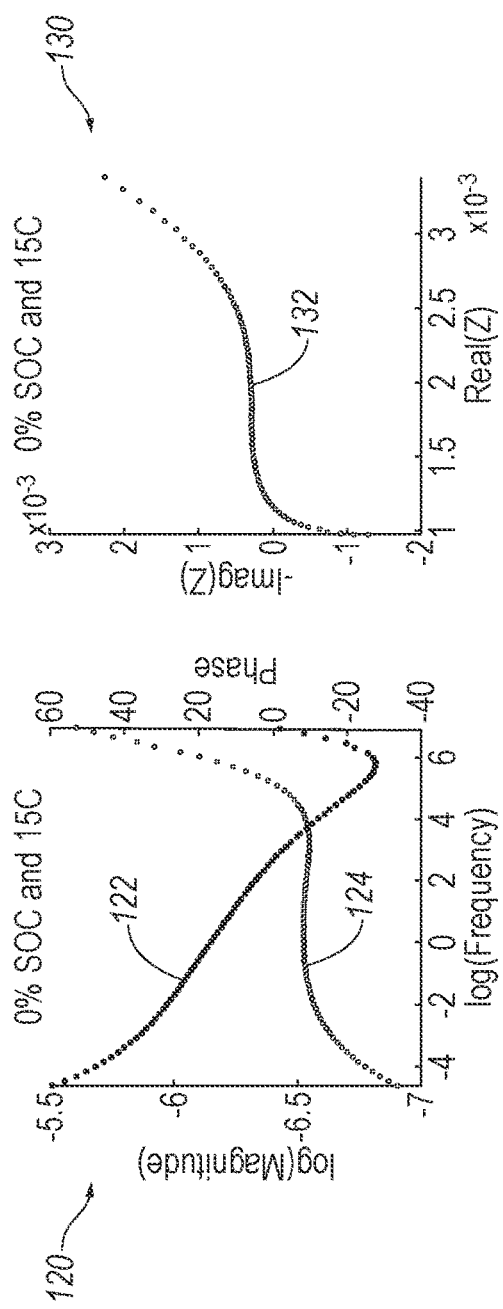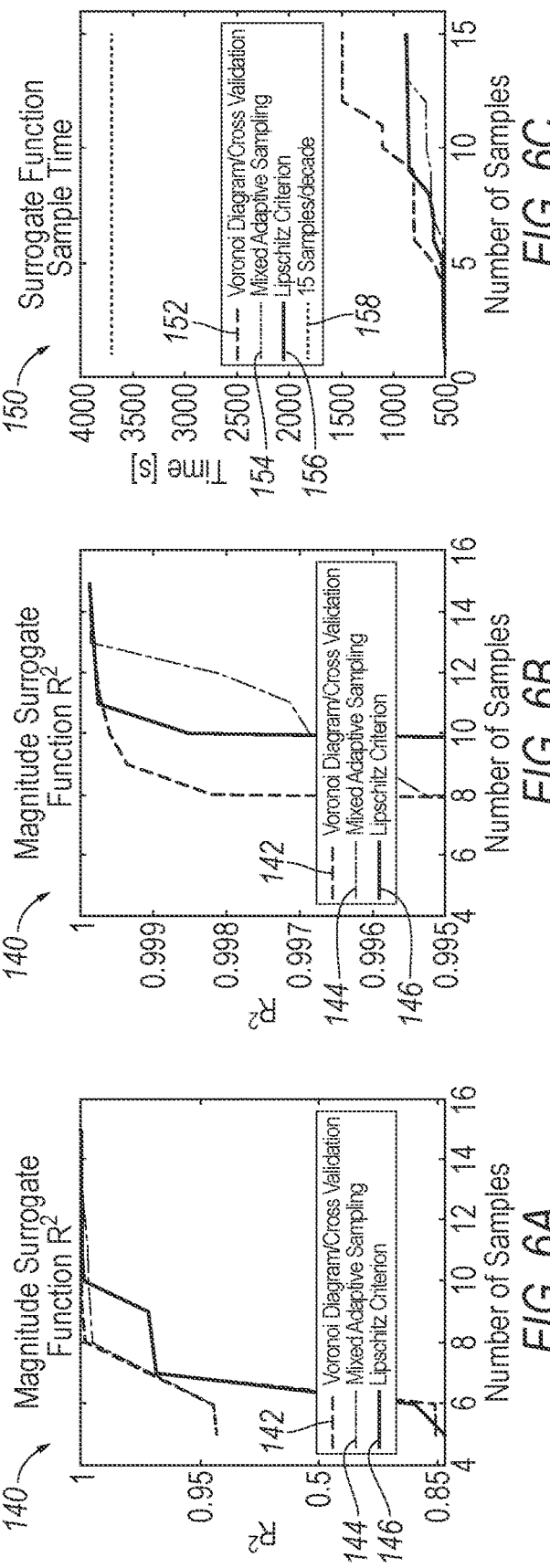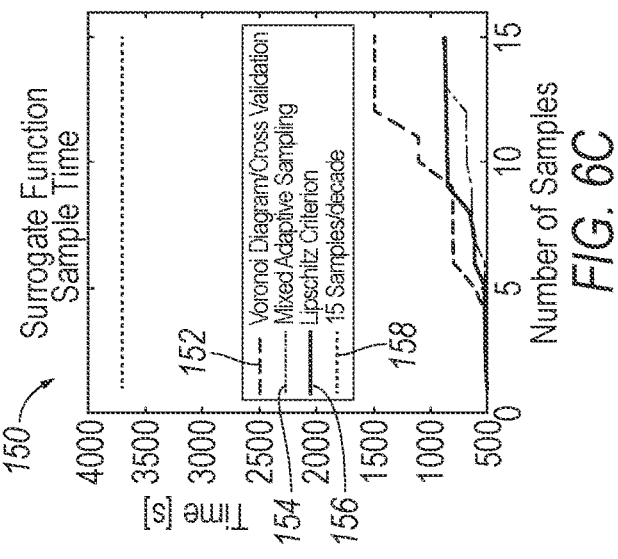
FIG. 5A
FIG. 5B
FIG. 6A
FIG. 6B
FIG. 6C

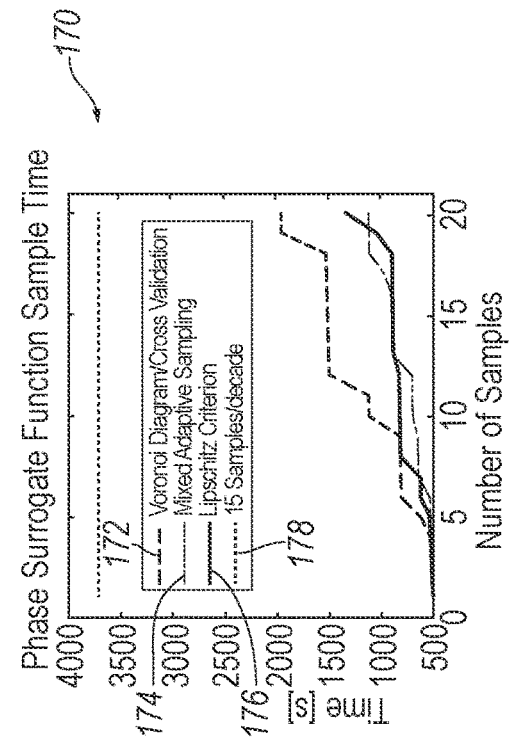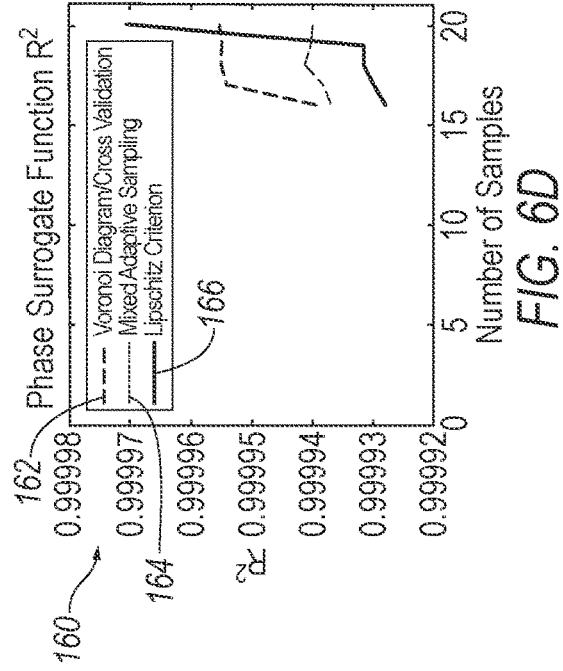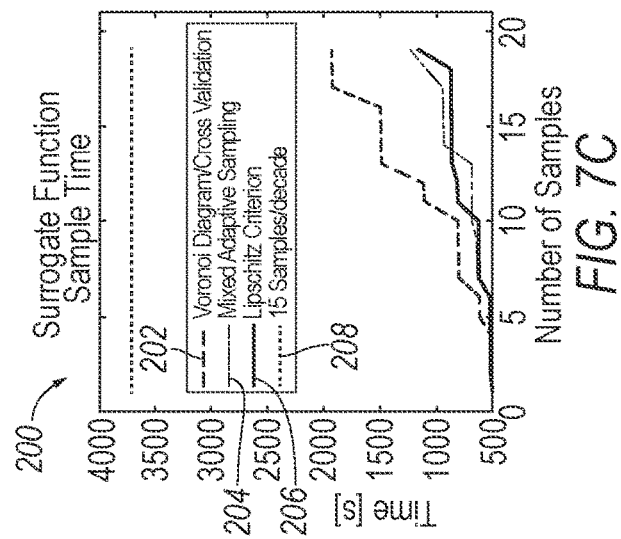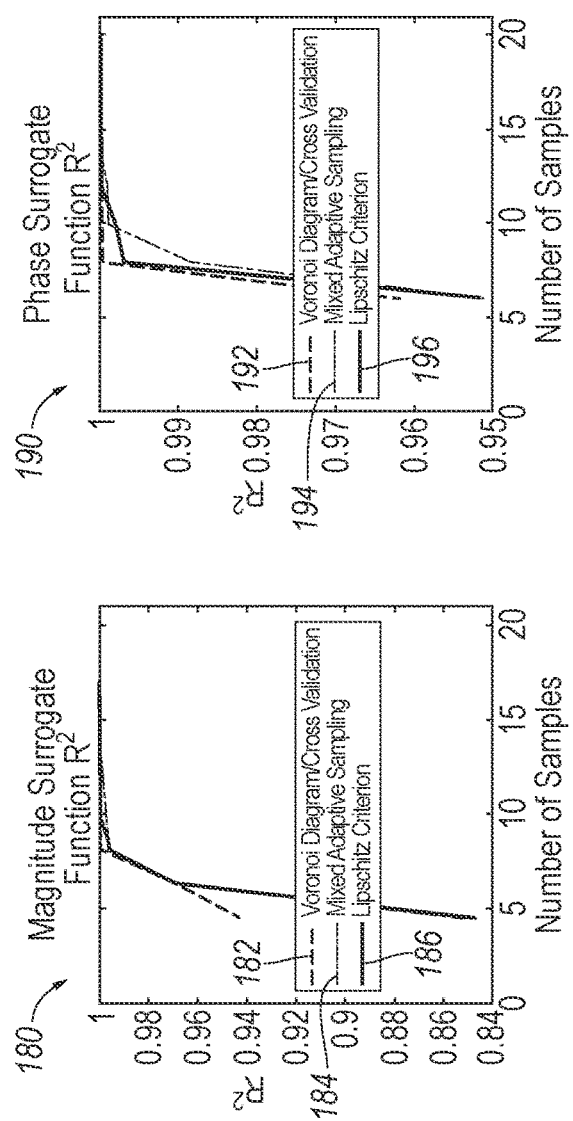
FIG. 6D
FIG. 6E
FIG. 7A
FIG. 7B
FIG. 7C

TRACTION BATTERY CONTROLLER OPERABLE TO CONTROL BATTERY BASED ON ADAPTIVE SAMPLED ELECTROCHEMICAL IMPEDANCE SPECTROSCOPY BATTERY MEASUREMENTS

TECHNICAL FIELD

The present disclosure relates to detecting an internal state of a traction battery of an electrified vehicle.

BACKGROUND

An electrified vehicle includes a traction battery for providing power to a motor of the vehicle to propel the vehicle. Electrochemical impedance spectroscopy (EIS) is used for detecting an internal state of the traction battery. The detected internal state of the traction battery is used in controlling the operation of the traction battery and/or the vehicle.

SUMMARY

A system includes a battery and a controller. The battery may be comprised of sub-component individual battery cells or virtual battery cells comprised of battery cells in parallel. The controller is configured to control the battery based on adaptive sampled electrochemical impedance spectroscopy (EIS) measurements of the battery.

The controller may be configured to perform the adaptive sampled EIS measurements. In this case, the controller may perform the adaptive sampled EIS measurements until the adaptive sampled EIS measurements are indicative of an impedance spectrum of the battery within a given tolerance. The controller may perform a first set of the adaptive sampled EIS measurements to detect magnitude components of the adaptive sampled EIS measurements and to then perform a second set of the adaptive sampled EIS measurements to detect phase components of the adaptive sampled EIS measurements. The controller may perform the adaptive sampled EIS measurements to iteratively detect magnitude and phase components of the adaptive sampled EIS measurements.

The controller may use the adaptive sampled EIS measurements to identify values of parameters of a model of the battery, such as resolved to its sub-component battery cells. In this case, the controller may use the model, with the identified values of the parameters, to detect an internal state of the battery whereby the controller detects the internal state of the battery based on the adaptive sampled EIS measurements.

The internal state of the battery may be a power capability of the battery whereby the controller controlling the battery based on the adaptive sampled EIS measurements involves the controller controlling the battery based on the power capability of the battery and/or the sub-component battery cells.

The internal state of the battery may be a state-of-charge of the battery whereby the controller controlling the battery based on the adaptive sampled EIS measurements involves the controller controlling the battery based on the state-of-charge of the battery and/or the sub-component battery cells.

The battery may be a traction battery. In certain variations, the battery and the controller are both on-board a vehicle. In other variations such as charging stations, the battery is on-board a vehicle and the controller is off-board the vehicle such as at the charging station.

A method for a vehicle having a traction battery and a controller is also provided. The method includes performing, by the controller, adaptive sampled EIS measurements of the traction battery. The method further includes controlling, with the controller, the traction battery and/or another component of the vehicle based on the adaptive sampled EIS measurements of the traction battery.

The method may further include detecting a distance-to-empty estimation of the vehicle based on the internal state of the traction battery and controlling the traction battery and/or another vehicle component according to the distance-to-empty estimation.

A vehicle having a traction battery and a controller is also provided. The controller is configured to charge and/or discharge the traction battery based on adaptive sampled EIS measurements of the traction battery.

BRIEF DESCRIPTION OF THE DRAWINGS

FIG. 5A illustrates a Nyquist graph including a plot of the magnitude component of measured samples of the impedance of the traction battery over a frequency range of interest and a plot of the phase component of measured samples of the impedance of the traction battery over the frequency range of interest;

FIG. 5B illustrates a Nyquist graph including a plot of the real and imaginary components of measured samples of the impedance of the traction battery over the frequency range of interest;

FIG. 6A illustrates a graph having first, second, and third plots of the percentage of variance of the magnitude component of a surrogate model of the impedance of the traction battery as obtained by the traction battery controller using first, second, and third adaptive sampling algorithms, for initially learning the magnitude component plots, relative to high-density uniform sampling, as a function of the number of measured samples of the impedance;

FIG. 6B illustrates an enlarged version of a portion of the graph of FIG. 6A;

FIG. 6C illustrates a graph having first, second, and third plots of the measurement time expended to obtain the magnitude component of the surrogate model of the impedance of the traction battery using the first, second, and third adaptive sampling algorithms as a function of the number of measured samples of the impedance, the graph further having a fourth plot of the measurement time expended to obtain the magnitude component of the impedance of the traction battery using the high-density uniform sampling;

FIG. 6D illustrates a graph having first, second, and third plots of the percentage of variance of the phase component of the surrogate model of the impedance of the traction battery as obtained by the traction battery controller using the first, second, and third adaptive sampling algorithms, for subsequently learning the phase component plots, relative to high-density uniform sampling as a function of the number of additional measured samples of the impedance;

FIG. 6E illustrates a graph having first, second, and third plots of the measurement time expended to obtain the phase component of the surrogate model of the impedance of the traction battery as a function of the number of additional measured samples of the impedance, the graph further having a fourth plot of the measurement time expended to obtain the phase component of the impedance of the traction battery using the high-density uniform sampling;

FIG. 7A illustrates a graph having first, second, and third plots of the percentage of variance of the magnitude component of a surrogate model of the impedance of the traction battery as obtained by the traction battery controller using the first, second, and third adaptive sampling algorithms, for iteratively learning the magnitude component plots, relative to high-density uniform sampling as a function of the number of measured samples of the impedance;

FIG. 7B illustrates a graph having first, second, and third plots of the percentage of variance of the phase component of the surrogate model of the impedance of the traction battery as obtained by the traction battery controller using the first, second, and third adaptive sampling algorithms, for iteratively learning the phase component plots, relative to high-density uniform sampling as a function of the number of measured samples of the impedance; and FIG. 7C illustrates a graph having first, second, and third plots of the measurement time expended to obtain the magnitude and phase components of the surrogate model of the impedance of the traction battery using the first, second, and third adaptive sampling algorithms as a function of the number of measured samples of the impedance, the graph further having a fourth plot of the measurement time expended to obtain the magnitude and phase components of the impedance of the traction battery using the high-density uniform sampling.

DETAILED DESCRIPTION

Detailed embodiments of the present disclosure are disclosed herein; however, it is to be understood that the disclosed embodiments are merely exemplary of the present disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
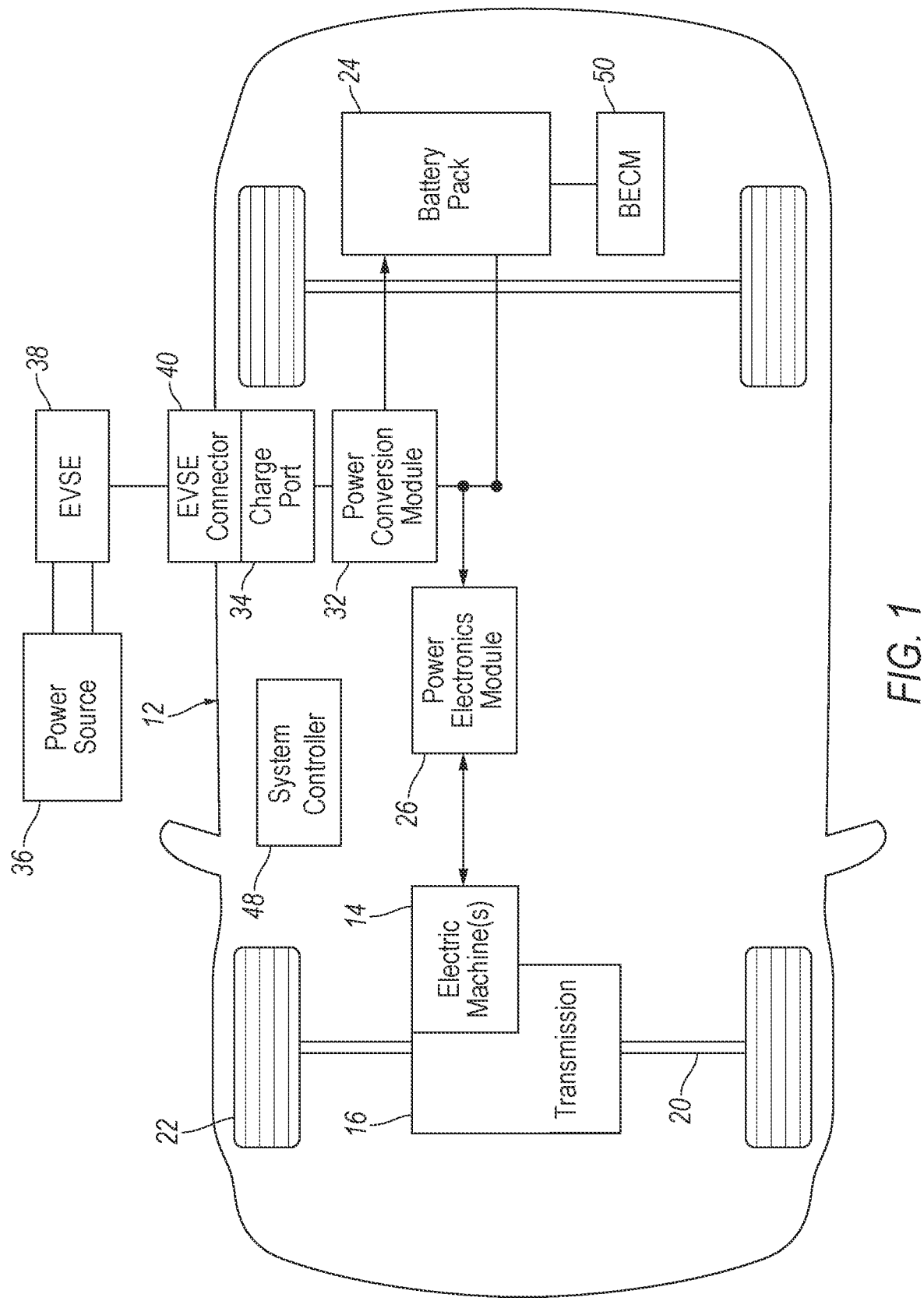
FIG. 1 illustrates a block diagram of a battery electric vehicle (BEV) having a traction battery.

Referring now to FIG. 1, a block diagram of an electrified vehicle 12 in the form of a battery electric vehicle (BEV) is shown. BEV 12 includes a powertrain having one or more traction motors ("electric machine(s)") 14, a traction battery ("battery" or "battery pack") 24, and a power electronics module 26 (e.g., an inverter). In the BEV configuration, traction battery 24 provides all of the propulsion power and the vehicle does not have an engine. In other variations, the electrified vehicle may be a plug-in hybrid electric vehicle (PHEV) further having an engine.

Traction motor 14 is part of the powertrain of BEV 12 for powering movement of the BEV. In this regard, traction motor 14 is mechanically connected to a transmission 16 of BEV 12. Transmission 16 is mechanically connected to a drive shaft 20 that is mechanically connected to wheels 22 of BEV 12. Traction motor 14 can provide propulsion capability to BEV 12 and is capable of operating as a generator.

Traction battery 24 stores electrical energy that can be used by traction motor 14 for propelling BEV 12. Traction battery 24 typically provides a high-voltage (HV) direct current (DC) output. Traction battery 24 is electrically connected to power electronics module 26. Traction motor 14 is also electrically connected to power electronics module 26. Power electronics module 26, such as an inverter, provides the ability to bi-directionally transfer energy between traction battery 24 and traction motor 14. For example, traction battery 24 may provide a DC voltage while traction motor 14 may require a three-phase alternating current (AC) current to function. Inverter 26 may convert the DC voltage to a three-phase AC current to operate traction motor 14. In a regenerative mode, inverter 26 may convert three-phase AC current from traction motor 14 acting as a generator to DC voltage compatible with traction battery 24.

In addition to providing electrical energy for propulsion of BEV 12, traction battery 24 may provide electrical energy for use by other electrical systems of the BEV such as HV loads like electric heater and air-conditioner systems and low-voltage (LV) loads such as an auxiliary battery.

Traction battery 24 is rechargeable by an external power source 36 (e.g., the grid). External power source 36 may be electrically connected to electric vehicle supply equipment (EVSE) 38. EVSE 38 provides circuitry and controls to control and manage the transfer of electrical energy between external power source 36 and BEV 12. External power source 36 may provide DC or AC electric power to EVSE 38. EVSE 38 may have a charge connector 40 for plugging into a charge port 34 of BEV 12.

A power conversion module 32 of BEV 12, such as an on-board charger having a DC/DC converter, may condition power supplied from EVSE 38 to provide the proper voltage and current levels to traction battery 24. Power conversion module 32 may interface with EVSE 38 to coordinate the delivery of power to traction battery 24.

The various components described above may have one or more associated controllers to control and monitor the operation of the components. The controllers can be microprocessor-based devices. The controllers may communicate via a serial bus (e.g., Controller Area Network (CAN)) or via discrete conductors.

For example, a system controller 48 ("vehicle controller") is present to coordinate the operation of the various components. Controller 48 includes electronics, software, or both, to perform the necessary control functions for operating BEV 12. Controller 48 may be a combination vehicle system controller and powertrain control module (VSC/PCM). Although controller 48 is shown as a single device, controller 48 may include multiple controllers in the form of multiple hardware devices, or multiple software controllers with one or more hardware devices. In this regard, a reference to a "controller" herein may refer to one or more controllers.

Controller 48 implements a battery energy control module (BECM) 50. BECM 50 is in communication with traction battery 24. BECM 50 is a traction battery controller operable for monitoring operating characteristics (e.g., an internal state) of traction battery 24 and for managing the charging and discharging of traction battery 24. BECM 50 implements algorithms to measure and/or estimate the operating characteristics of traction battery 24. BECM 50 controls the operation and performance of traction battery 24 based on the operating characteristics of the traction battery. BECM 50 or other controllers may control the operation and performance of other systems and components of BEV 12 based on the operating characteristics of traction battery 24.

Operating characteristics of traction battery 24 include the charge capacity and the state-of-charge (SOC) of traction battery 24. The charge capacity of traction battery 24 is indicative of the maximum amount of electrical energy that the traction battery may store. The SOC of traction battery 24 is indicative of a present amount of electrical charge stored in the traction battery. The SOC of traction battery 24 may be represented as a percentage of the maximum amount of electrical charge that may be stored in the traction battery.

Another operating characteristic of traction battery 24 is the power capability of the traction battery. The power capability of traction battery 24 is a measure of the maximum amount of power the traction battery can provide or receive for a specified time period. As such, the power capability of traction battery 24 corresponds to discharge and charge power limits which define the amount of electrical power that may be supplied by or to the traction battery at a given time. These limits can be provided to other vehicle controls, for example, through a vehicle system controller (VSC), so that the information can be used by systems that may draw power from or provide power to traction battery 24. Vehicle controls are to know how much power traction battery 24 can provide (discharge) or take in (charge) in order to meet driver demand and to optimize the energy usage. As such, knowing the power capability of traction battery 24 allows electrical loads and sources to be managed such that the power requested is within the limits that the traction battery can handle.

Figure 2:
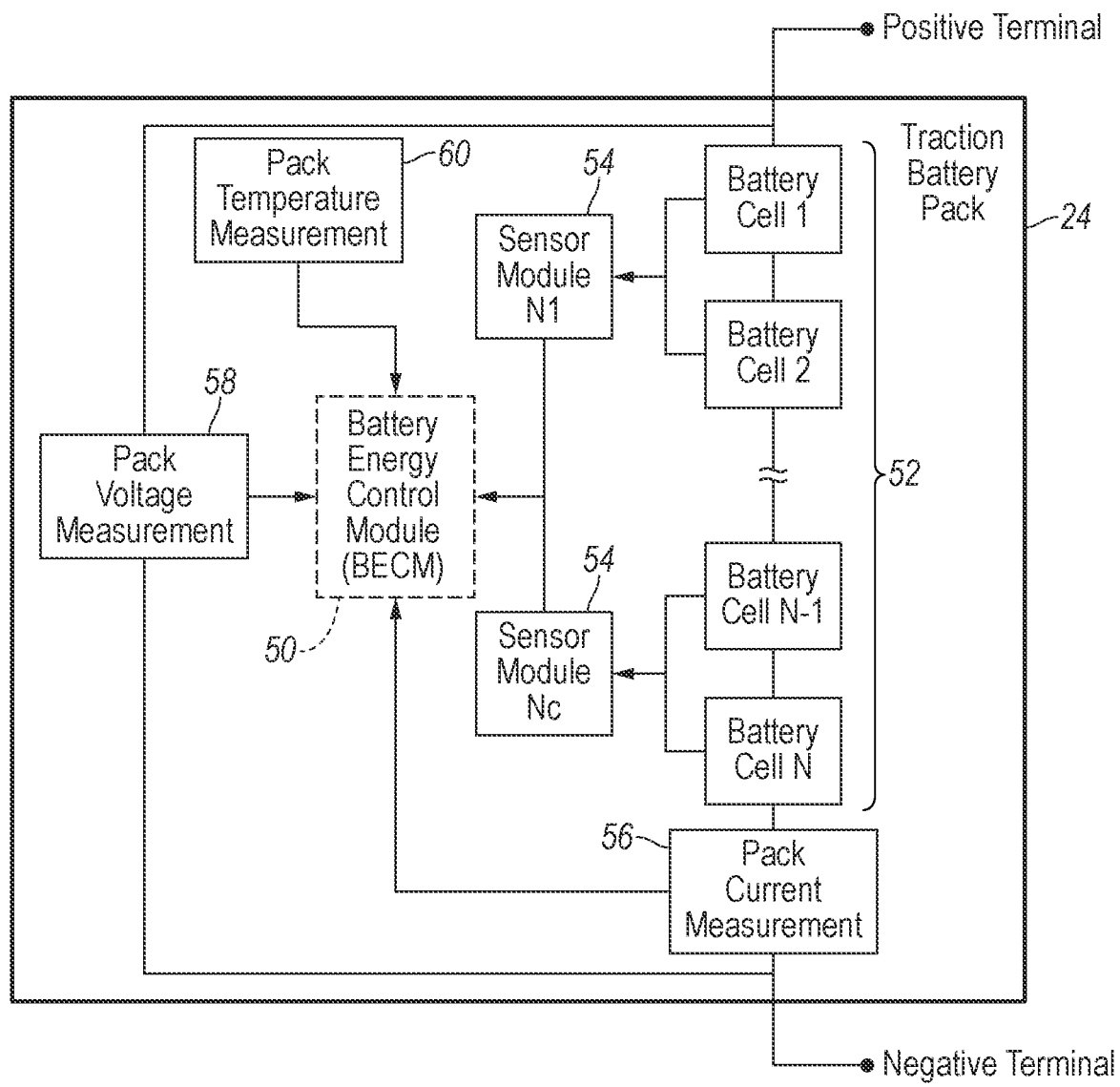
FIG. 2 illustrates a block diagram of an arrangement for a traction battery controller to monitor the traction battery.

Referring now to FIG. 2, with continual reference to FIG. 1, a block diagram of an arrangement for BECM 50 to monitor traction battery 24 is shown. Traction battery 24 is comprised of a plurality of battery cells 52. Battery cells 52 are physically connected together (e.g., connected in series as shown in FIG. 2). In variations, traction battery 24 is comprised of sub-component individual battery cells or virtual battery cells comprised of battery cells connected in parallel.

BECM 50 is operable to monitor pack level characteristics of traction battery 24 such as battery current 56, battery voltage 58, and battery temperature 60. Battery current 56 is the current outputted (i.e., discharged) from or inputted (i.e., charged) to traction battery 24. Battery voltage 58 is the terminal voltage of traction battery 24.

BECM 50 is also operable to measure and monitor battery cell level characteristics of battery cells 52 of traction battery 24. For example, terminal voltage, current, and temperature of one or more of battery cells 52 may be measured. BECM 50 may use a battery sensor 54 to measure the battery cell level characteristics. Battery sensor 54 may measure the characteristics of one or multiple battery cells 52. BECM 50 may utilize Nc battery sensors 54 to measure the characteristics of all battery cells 52. Each battery sensor 54 may transfer the measurements to BECM 50 for further processing and coordination. Battery sensor 54 functionality may be incorporated internally to BECM 50.

Traction battery 24 may have one or more temperature sensors such as thermistors in communication with BECM 50 to provide data indicative of the temperature of battery cells 52 of traction battery 24 for the BECM to monitor the temperature of the traction battery and/or the battery cells. BEV 12 may further include a temperature sensor to provide data indicative of ambient temperature for BECM 50 to monitor the ambient temperature.

BECM 50 controls the operation and performance of traction battery 24 based on the monitored traction battery and battery cell level characteristics. For instance, BECM 50 may use the monitored characteristics to detect (i.e., estimate) an internal state (e.g., the charge capacity, the SOC, and/or the power capability) of traction battery 24 such as for use in controlling the traction battery and/or BEV 12.

As known by those of ordinary skill in the art, BECM 50 may detect an internal state of traction battery 24 by using an observer, wherein a battery model (i.e., "equivalent circuit model" (ECM)) is used for construction of the observer, with measurements of battery current, battery terminal voltage, and battery temperature. Values of parameters of the ECM may be identified through recursive estimation based on such measurements.

BECM 50 is configured to deduce an estimate of an internal state of traction battery 24 with use of the ECM. For the internal state estimate to be accurate, the ECM has to accurately model traction battery 24. For the ECM to accurately model traction battery 24, (i) the ECM has to have a set of parameters at least substantially similar to the parameters of an ECM that accurately models traction battery 24 (i.e., from amongst a set of candidate ECMs, a "proper" ECM that is fairly representative of the traction battery has to be initially chosen) and (ii) the estimated values of the parameters of the ECM have to be at least substantially similar to the values of the parameters of the ECM that accurately models the traction battery (i.e., the estimated parameter values have to be at least substantially similar to the actual parameter values).

BECM 50 is configured to implement electrochemical impedance spectroscopy (EIS) to estimate the parameter values of the ECM in order to use the ECM to detect an internal state of traction battery 24. EIS is a non-invasive technique to measure the internal state of traction battery 24. EIS is sensitive to internal state factors of traction battery 24 including state-of-charge, state-of-health, temperature, and the like.

BECM 50 implements EIS to measure impedance of traction battery 24 by applying to the traction battery, across a range of frequencies, a relatively small amplitude current or voltage sinusoid stimulus and then measuring the voltage or current response of the traction battery. The impedance response can be taken as characteristic of the battery assembly and can also be resolved to parallel groups of individual battery cells. The impedance data of traction battery 24 (i.e., the EIS measurements) is then "fitted" to the ECM to estimate the values of the parameters of the ECM. The goal is to find the ECM parameters which cause the best agreement between an impedance spectrum of the ECM and the measured impedance data of traction battery 24.

Figure 3:
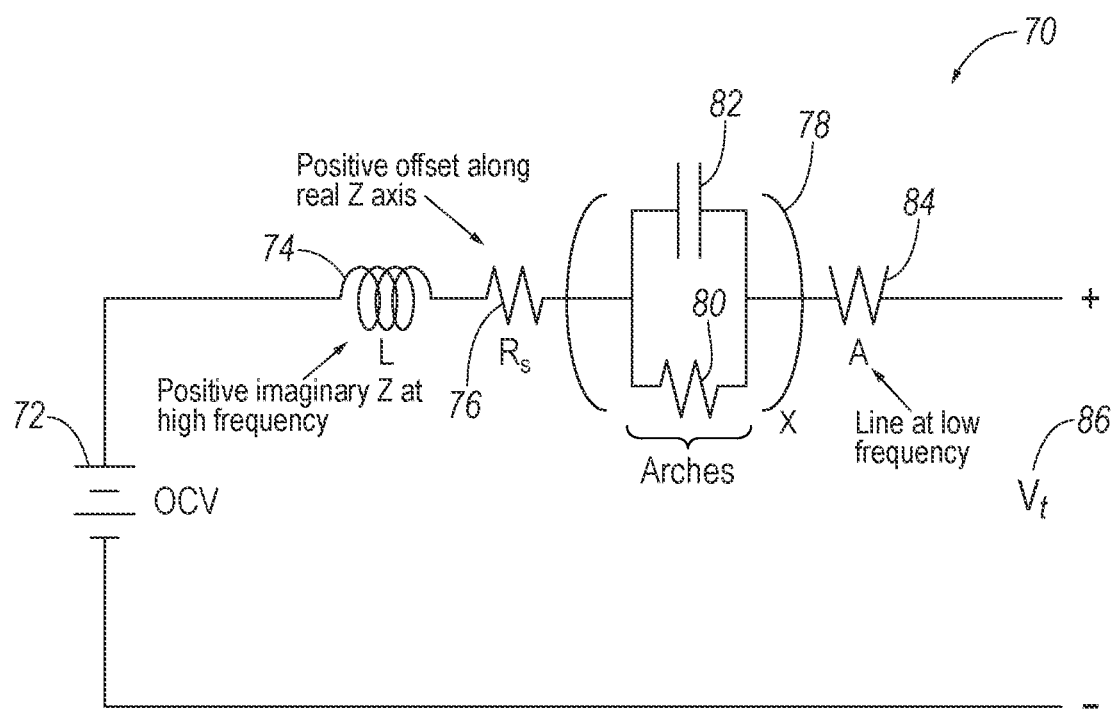
FIG. 3 illustrates a schematic diagram of an equivalent circuit model (ECM) of the traction battery.

Referring now to FIG. 3, with continual reference to FIGS. 1 and 2, a schematic diagram of an ECM 70 of traction battery 24 is shown. Traction battery 24 may be modeled as a circuit, as indicated, and ECM 70 is one possible traction battery ECM. An ECM includes one or more circuit elements (i.e., one or more "parameters"). Per ECM 70, traction battery 24 is modeled as a circuit having in series a voltage source ("$V_{OC}$") (open-circuit voltage (OCV)) 72, an inductor ("L") 74, a resistor ("$R_S$") 76, one or more RC circuit elements 78, each circuit element including a resistor ("$R_X$") 80 and a capacitor ("$C_X$") 82 connected in parallel, and a constant phase element (CPE) ("A") 84. Voltage ("$V_t$") 86 is the voltage across the terminals of traction battery 24 (i.e., the terminal voltage).

An equation for the impedance (Z) of ECM 70 is as follows:

$$Z = i\omega L + R_s + \left( \cfrac{1}{\cfrac{1}{R_x} + Q_x(i\omega)^n} \right) + \frac{A}{\sqrt{\omega}} + \frac{A}{i\sqrt{\omega}}$$

The parameters of ECM 70 include L, $R_S$, $R_X$, $C_X$, and A. These parameters are to have values whereby the calculated impedance of the ECM corresponds to the measured impedance of traction battery 24. As such, it is required that ECM 70 be an ECM having a proper set of parameters in correspondence with traction battery 24 and the values of the parameters of ECM 70 be accurate so that ECM 70 accurately models the behavior of traction battery 24. This algorithmic process can be repeated with circuit models for each component battery cell in traction battery 24. The combined behavior of the component battery cells comprises the internal state of traction battery 24.

As set forth, tracking traction battery internal state is useful for controlling charging rate, controlling traction battery power delivery, monitoring traction battery health including capacity estimation, etc. However, external measurement of traction battery internal state is obscured by long relaxation times and state variables that are defined by integration algorithms. EIS is a technique that promises to yield information relatively more rapidly about traction battery internal state by probing the complex electrical response (via the small amplitude current or voltage sinusoid stimulus) across a range of frequencies.

As noted, BECM 50 implements EIS by applying a sinusoidal electrical stimulus to traction battery 24 and measuring the electrical output of the traction battery to the stimulus. For instance, the stimulus applied to the traction battery is a voltage in which case the output of the traction battery is a current to thereby obtain an impedance measurement (i.e., Z=V/I, where Z is the impedance, V is the voltage applied to the traction battery, and I is the current output from the traction battery). Alternatively, the stimulus applied to the traction battery is a current in which case the output of the traction battery is a voltage to thereby obtain an impedance measurement (i.e., Z=V/I, where Z is the impedance, V is the voltage output from the traction battery, and I is the current applied to the traction battery). As such, the input stimulus is of one type of variable (i.e., one of voltage or current) whereas the output is of the other type of variable (i.e., the other one of voltage or current). BECM 50 is capable of battery pack-resolved EIS with full-pack current and voltage sensors and is capable of cell-resolved EIS due to individual-cell current or voltage sensors. Alternately, application specific integrated circuits can be used to perform EIS measurements.

Each measured impedance is a "complex impedance" as the impedance includes a magnitude and a phase. Alternatively, according to another frame of reference, each measured impedance includes a real component and an imaginary component.

Each measured impedance is a "sample". The measurement process is repeated with the sinusoidal electrical stimulus at different frequencies to obtain additional impedance measurements (i.e., additional samples) at each of the frequencies. That is, the frequency of the sinusoidal electrical stimulus is varied to yield a measurement spectrum of impedance as a function of frequency. The range of frequencies is useful because varied frequencies can stimulate various internal processes (i.e., charge-transfer processes, diffusion processes, etc.) of traction battery 24 that can be calibrated or modeled to produce useful information about the internal state of the traction battery (e.g., state-of-charge, state-of-health, internal temperature, etc.).

Often in laboratory settings, the frequency range can span several decades in log-space and range from a highest frequency (e.g., 1.0 MHz) to a lowest frequency (e.g., 1.0 mHz). It is typical for ten to fifteen measurements to be collected per decade of frequency. The low frequency data takes relatively long to collect as the sinusoidal periods are relatively longer in time. Further, for low frequency data, several periods may be needed to average out measurement noise or to compensate for voltage drift due to system polarization changes. As an example, fifteen measurements per decade (i.e., high density uniform sampling) over a frequency range of 0.01-1000 Hz using a commercial EIS measurement device takes on the order of an hour.

An hour is a prohibitive amount of time to perform EIS measurements on-board a vehicle or at a public charging station. An hour for a full EIS scan on-board BEV 12 is prohibitive because traction battery 24 changes states while the BEV is being driven. An hour for a full EIS scan at a charging station is prohibitive because the user may not charge traction battery 24 for that length of time. Therefore, in order to be able to utilize EIS on-board BEV 12 or at a charging station, the EIS measurement time for a full scan has to be reduced.

In accordance with the present disclosure, BECM 50 is operable to detect the internal state of traction battery 24 using adaptive sampling (or adaptive learning) for decreased EIS measurement time. That is, BECM 50 uses adaptive sampling to decrease the EIS measurement time for a given frequency range. The EIS results using adaptive sampling are effectively equivalent to the EIS results using high density uniform sampling. As such, the internal state detected by BECM 50 using adaptive EIS sampling is effectively the same as the internal state that would be detected by the BECM using uniform EIS sampling. The decreased EIS measurement time is a result of the adaptive EIS sampling involving, in many cases, a 50-75% reduction in the number of samples compared to high density uniform EIS sampling.

By using adaptive sampling for EIS measurements, BECM 50 implements a method for learning the impedance of traction battery 24 over the full frequency range of interest in a reduced amount of time compared to high density uniform sampling. Per ordinary fashion, BECM 50 fits the impedance of traction battery 24 learned from using adaptive EIS sampling to the ECM of the traction battery for the BECM to estimate the values of the parameters of the ECM. In turn, BECM 50 detects the internal state of traction battery 24 using the ECM. In this way, BECM 50 detects the internal state of traction battery 24 using an ECM of the traction battery that is based on adaptive sampled EIS measurement information. The adaptive sampling and EIS measurements can resolve information down to the virtual cell level.

The method of reducing EIS data acquisition time when implemented by BECM 50 makes EIS useful on-board BEV. The method of reducing EIS data acquisition time also makes EIS useful when implemented off-board such as at BEV charging stations. Herein, for convenience, BECM 50 is mainly referred to as using adaptive sampling for decreased EIS measurement time.

As an overview, BECM 50 uses adaptive sampling (or active learning) approaches to reduce the number of impedance samples required to define a meta- or surrogate model that is equivalent to a uniform high-density sampling of the impedance. To accomplish this, BECM 50 begins with making EIS measurements at a sparse uniform grid that contains the minimum and maximum frequencies of interest. As an alternative to a uniform grid, a sparse set of frequency points from a previous measurement may be used for an initial canvas. This may include points based on an immediately preceding EIS measurement or based on a calibration dependent on operating parameters such as temperature and internal battery state. BECM 50 fits the surrogate models for the magnitude and phase components of the impedance to the measured impedance points. For instance, BECM 50 uses spline or other functions to fit the magnitude and the phase to the points. This can also be done using the real and imaginary components of the impedance as they are mathematically interchangeable with the magnitude and phase components of the impedance.

BECM 50 then uses an adaptive sampling algorithm to select the next measurement point based on two competing metrics: 1) grid exploration (i.e., measuring in areas of low point density); and 2) model exploitation (i.e., adding points where the model indicates that more points may be necessary due to high curvature, rapid functional changes, etc.). These competing metrics define the nature of the adaptive sampling algorithm. For reference, many adaptive sampling (or active learning) approaches have been published in the academic literature.

BECM 50 can apply the adaptive sampling algorithm to the two plots (i.e., the magnitude plot and the phase plot) in series (i.e., magnitude first followed by phase), iteratively (i.e., magnitude, phase, magnitude, phase . . . ), or by some other method (e.g., use Kramers-Kronig relations to infer one plot from the other plot). BECM 50 repeats the process of adding points until some stopping criterion is achieved. The stopping criterion could be a set number of samples, a difference between the two-norm of the surrogate functions between successive iterations, etc. The stopping criteria may depend on the full-pack behavior or on the behavior of individual or groups of battery cells.

Figure 4:
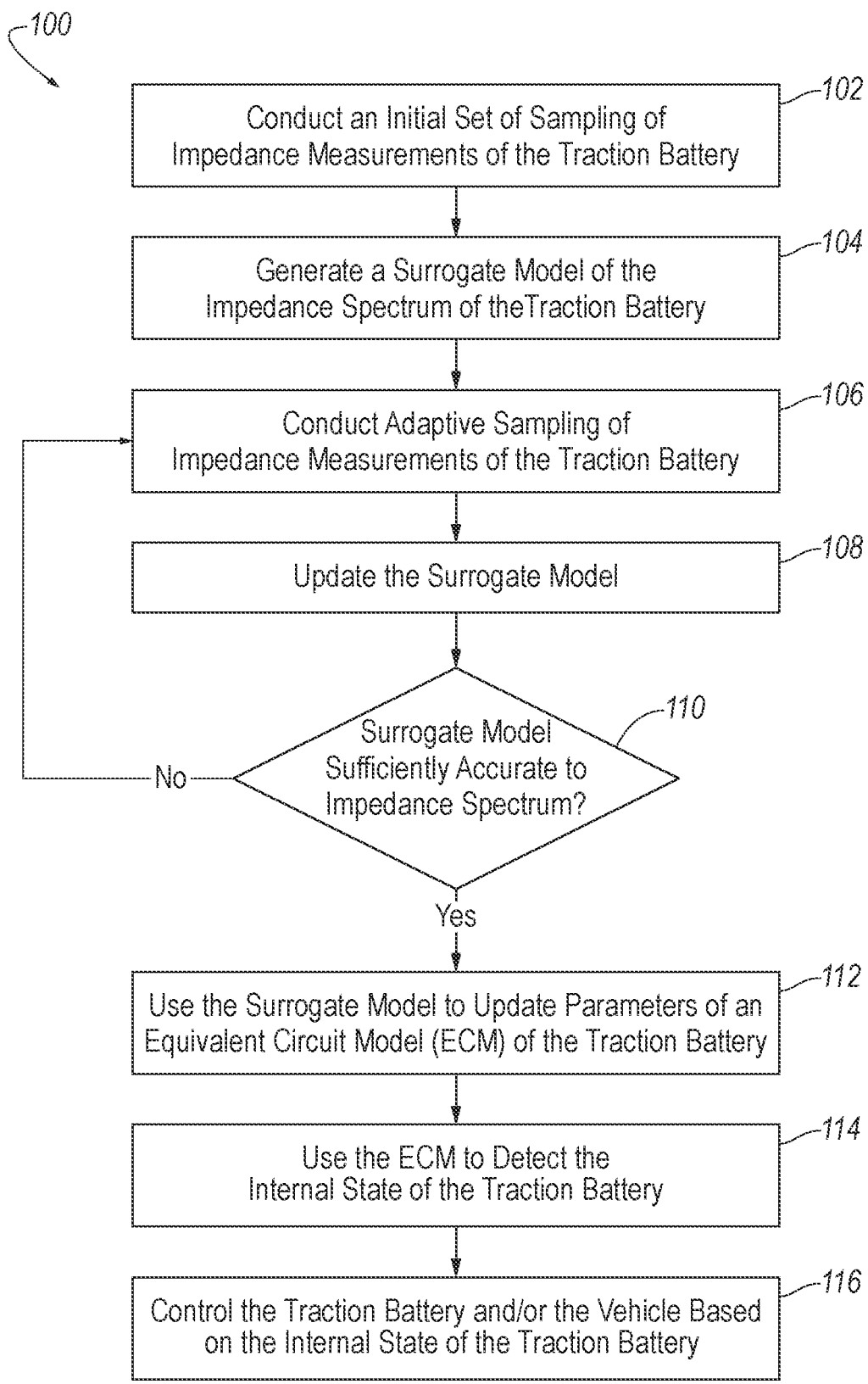
FIG. 4 illustrates a flowchart depicting operation carried out by the traction battery controller for detecting the internal state of the traction battery using adaptive sampling (or adaptive learning) for decreased time of electrochemical impedance spectroscopy (EIS) measurements of the traction battery over a frequency range of interest.

In further detail, referring now to FIG. 4, a flowchart 100 depicting operation carried out by BECM 50 for detecting the internal state of traction battery 24 using adaptive sampling for decreased EIS measurement time is shown. The operation begins with BECM 50 measuring an initial set of impedance samples of traction battery 24 over a frequency range of interest, per process block 102. As noted above, each impedance sample measured by BECM 50 entails the BECM applying a sinusoidal electrical stimulus at a given frequency to traction battery 24 and measuring the electrical output of the traction battery to the stimulus. As such, the initial set of impedance samples are measured by BECM 50 applying a sinusoidal electrical stimulus at a corresponding set of different frequencies to traction battery 24 and the BECM measuring the electrical output of the traction battery to each stimulus. The different frequencies are, for example, at respective decades of frequency (or smaller interval) over the frequency range of interest. As an example, the number of impedance samples in the initial set of samples measured in process block 102 may be on the order of 5-15% of the number of samples measured in high density uniform EIS sampling.

BECM 50 generates, based on the initial set of impedance samples, a surrogate model of the impedance spectrum of traction battery 24, per process block 104. As noted above, each measured impedance sample includes a magnitude component and a phase component (or, alternatively, a real component and an imaginary component). As such, the surrogate model of the impedance spectrum includes a plot of the magnitude components of the initial set of samples and a plot of the phase components of the initial set of samples. As each plot is based on, for instance, 5-15% of the number of samples measured in the uniform high density EIS sampling, the plots of the surrogate model will be at best a rough approximation of the magnitude and phase components of the impedance spectrum of traction battery 24.

BECM 50 may further consider generalized information concerning the expected behavior of the impedance spectrum of traction battery 24 in generating the surrogate model. For instance, such expected attributes of the impedance spectrum of traction battery 24 include no discontinuities expected in the plots of the surrogate model, the plots of the surrogate model are expected to be well-behaved, smooth plots, the plots of the surrogate model are expected to increase/decrease over certain frequency intervals, etc. As such, with BECM 50 further considering the expected behavior of the impedance spectrum of traction battery 24, the plots of the surrogate model will be a better approximation of the magnitude and phase components of the impedance spectrum of traction battery 24.

BECM 50 then performs adaptive sampling of the impedance of traction battery 24, per process block 106. The adaptive sampling involves BECM 50 measuring a sample of the impedance of traction battery 24 at a selected frequency within the frequency range of interest. As such, BECM 50 applies a sinusoidal electrical stimulus at the selected frequency to traction battery 24 and measures the electrical output of the traction battery to the stimulus to thereby obtain the measured impedance sample.

The "adaptive" sampling pertains to the choice of the selected frequency for the measured impedance sample. Particularly, as referenced above, BECM 50 selects the selected frequency (i.e., selects the next impedance measurement point) based on grid exploration (measuring in an area of the frequency range of low point density—i.e., the number of impedance samples in this area of the frequency range is lower than the number of impedance samples in other areas of the frequency range) and model exploitation (measuring in an area of the frequency range where the surrogate model indicates more points may be desired—i.e., the approximation of the magnitude and phase components of the impedance spectrum of traction battery 24 appears relatively poorer in this area of the frequency range than in other areas of the frequency range).

Upon completion of process block 106, the total number of measured impedance samples includes (i) the number of the measured impedance samples in the initial set, per process block 102, and (ii) the adaptive sampled measured impedance sample, per process block 106. BECM 50 then updates the surrogate model further considering the adaptive sampled measured impedance sample, per process block 108. As such, the plot of the magnitude components of the surrogate model further includes the magnitude component of the adaptive sampled measured impedance sample and the plot of the phase components of the surrogate model further includes the phase component of the adaptive sampled measured impedance sample. Accordingly, the plots of the surrogate model will now be a better approximation of the magnitude and phase components of the impedance spectrum of traction battery 24 in that each plot includes one more additional measurement.

BECM 50 then decides as to whether the surrogate model of the impedance is sufficiently equivalent to the impedance spectrum of traction battery 24 (i.e., whether the surrogate model sampling is sufficiently equivalent to the high-density uniform EIS sampling), as indicated by decision block 110.

If the surrogate model of the impedance is not sufficiently equivalent to the impedance spectrum of traction battery 24, then another cycle of the adaptive sampling operation of process block 106, the surrogate model updating operation of process block 108, and the comparison decision operation of process block 110 are performed. Particularly, BECM 50 performs another cycle of adaptive sampling of the impedance of traction battery 24, per process block 106. The adaptive sampling in this cycle involves BECM 50 measuring another sample of the impedance of traction battery 24 at another selected frequency within the frequency range of interest. BECM 50 selects this selected frequency based on grid exploration and model exploitation. Now, the total number of measured impedance samples includes (i) the number of the measured impedance samples in the initial set, per process block 102, (ii-a) the initial adaptive sampled measured impedance sample, per the initial iteration of process block 106, and (ii-b) the additional adaptive sampled measured impedance sample, per the additional iteration of process block 106. BECM 50 then updates the surrogate model further considering the additional adaptive sampled measured impedance sample, per process block 108. As such, the plot of the magnitude components of the surrogate model further includes the magnitude component of the additional adaptive sampled measured impedance sample and the plot of the phase components of the surrogate model further includes the phase component of the additional adaptive sampled measured impedance sample. Accordingly, the plots of the surrogate model will now be an even better approximation of the magnitude and phase components of the impedance spectrum of traction battery 24 in that each plot includes one more additional measurement. BECM 50 then decides as to whether the surrogate model of the impedance is now sufficiently equivalent to the impedance spectrum of traction battery 24, per decision block 110.

Additional cycles of the adaptive sampling operation of process block 106, the surrogate model updating operation of process block 108, and the comparison decision operation of decision block 110 are performed until BECM 50 decides that the surrogate model of the impedance is sufficiently equivalent to the impedance spectrum of traction battery 24, per decision block 110. BECM 50 may decide the surrogate model of the impedance to be sufficiently equivalent to the impedance spectrum of traction battery 24 after a set number of impedance samples have been measured, differences between the immediate previous version of the surrogate model and the current version of the surrogate model are sufficiently small, etc.

Once the surrogate model of the impedance is sufficiently equivalent to the impedance spectrum of traction battery 24, BECM 50 terminates any further adaptive sampling. In turn, BECM 50 uses the surrogate model to update the parameters of the ECM of traction battery 24, per process block 112. BECM 50 uses the ECM, having the updated parameters, to detect the internal state of traction battery 24, per process block 114.

BECM 50 controls traction battery 24 and/or other components of BEV 12 based on the internal state of the traction battery, per process block 116. For instance, the internal state of traction battery 24 may be a power capability of traction battery 24, a state-of-charge (SOC) of the traction battery, and/or a distance-to-empty (DTE) estimation of BEV 12, and BECM 50 controls the traction battery and/or a component of BEV 12 according to the internal state of the traction battery.

To illustrate benefits of the adaptive sampling operation used by BECM 50 to decrease EIS measurement time, refer now to FIGS. 5A and 5B. FIG. 5A illustrates a Nyquist graph 120 including a plot 122 of the magnitude component of measured samples of the impedance of traction battery 24 over a frequency range of interest and a plot 124 of the phase component of measured samples of the impedance of the traction battery over the frequency range of interest. As shown, the measured impedance data of traction battery 24 takes the form of two curves (i.e., plots 122 and 124) when plotted. (For completeness, FIG. 5B illustrates a Nyquist graph 130 including a plot 132 of the real and imaginary components of measured samples of the impedance of the traction battery over the frequency range of interest. As indicated, Nyquist graphs 120 and 130 are depictive of identical data.)

Magnitude plot 122 and phase plot 124 are experimental data from a traction battery pouch cell acquired at 0% SOC and at 15° C. This cell state was arbitrarily selected, and similar results would be achieved at different SOCs and temperatures. In this example, the experimental data is shown for a 76-point scan (i.e., 76 impedance samples) with a high-density uniform sampling of fifteen points per decade of frequency of the frequency range of interest. The frequency range of interest is f=0.01-1000 Hz.

The adaptive sampling operation is to obtain a surrogate model of the impedance that is sufficiently accurate to the impedance spectrum of the traction battery. Magnitude plot 122 and phase plot 124 represent the impedance spectrum of traction battery 24. As such, magnitude plot 122 and phase plot 124 are to be learned by using the adaptive sampling operation. That is, a plot of the magnitude components of the surrogate model is to be sufficiently similar to magnitude plot 122 and a plot of the frequency components of the surrogate model is to be sufficiently similar to phase plot 124. For this example, the goal is for the adaptive sampling operation to learn the magnitude and phase plots in considerably less than the 76-point scan impedance measurements.

FIGS. 6A, 6B, 6C, 6D, and 6E pertain to the results for sequentially (serially) learning the magnitude and phase curves in series using any one of three different adaptive sampling algorithms. Learning the magnitude and phase curves in series means that the magnitude curve is learned initially using adaptive sampling and then the phase curve is learned subsequently using adaptive sampling. (Likewise, learning the phase and magnitude curves in series means that the phase curve is learned initially using adaptive sampling and then the magnitude curve is learned subsequently using adaptive sampling.)

In further detail, FIG. 6A illustrates a graph 140 having first, second, and third plots 142, 144, and 146 of the percentage of variance of the magnitude component of a surrogate model of the impedance of traction battery 24 as obtained by BECM 50 using first, second, and third adaptive sampling algorithms, for initially learning the magnitude component plots, relative to high-density uniform sampling as a function of the number of measured samples of the impedance. The first adaptive sampling algorithm is the Voronoi Diagram/Cross Validation sampling algorithm; the second adaptive sampling algorithm is the Mixed Adaptive Sampling algorithm; and the third sampling algorithm is the Lipschitz Criterion sampling algorithm. These sampling algorithms are known by those of ordinary skill in the art. These sampling algorithms are provided as examples and other sampling algorithms could be used.

FIG. 6B illustrates an enlarged version of a portion of graph 140. As shown in FIG. 6B, each of the three adaptive sampling algorithms achieve near parity (i.e., $R^2>0.9999$) with magnitude plot 122 of the 76-point experimental scan after about only fourteen impedance samples.

FIG. 6C illustrates a graph 150 having first, second, and third plots 152, 154, and 156 of the measurement time expended to obtain the magnitude component of the surrogate model of the impedance of traction battery 24 using the first, second, and third adaptive sampling algorithms as a function of the number of measured samples of the impedance. Graph 150 also includes a fourth plot 158 of the measurement time expended to obtain the magnitude component of the impedance of traction battery 24 using a high-density uniform sampling (namely, fifteen samples per decade of frequency). As shown in graph 150, each of the three adaptive sampling algorithms takes about 2×-4× less time than the time expended for obtaining the 76-point scan impedance measurements.

FIG. 6D illustrates a graph 160 having first, second, and third plots 162, 164, and 166 of the percentage of variance of the phase component of the surrogate model of the impedance of traction battery 24 as obtained by BECM 50 using the first, second, and third adaptive sampling algorithms, for subsequently learning the phase component plots, relative to high-density uniform sampling as a function of the number of additional measured samples of the impedance. FIG. 6E illustrates a graph 170 having first, second, and third plots 172, 174, and 176 of the measurement time expended to obtain the phase component of the surrogate model of the impedance of traction battery 24 as a function of the number of additional measured samples of the impedance. Graph 170 also includes fourth plot 158 of the measurement time expended to obtain the phase component of the impedance of traction battery 24 using the high-density uniform sampling.

In operation, after first solving for the magnitude curve (the subject of FIGS. 6A, 6B, and 6C), the already sampled points yield a relatively high $R^2$ in the phase curve. Five more impedance samples were measured to enhance the phase curve agreement. Thus, there is a net reduction of 2×-3× in the sample time for learning the magnitude and phase curves as compared to the time expended for obtaining the 76-point experimental scan.

As described, FIGS. 6A, 6B, 6C, 6D, and 6E pertain to the magnitude and phase curves, as a function of frequency, being predicted separately and in series (magnitude first, phase second) relative to a case where fifteen impedance samples were acquired per decade of frequency. The $R^2$ is used as a comparison between the adaptive sampling prediction and the high-density uniform sample case. Graph 170 of FIG. 6E is indicative of the accumulated sample time as each measurement is conducted.

FIGS. 7A, 7B, and 7C pertain to the results for learning the magnitude and phase curves iteratively using any of the three different adaptive sampling algorithms. Learning the magnitude and phase curves iteratively means that the magnitude curve is updated following an adaptive sampled measurement, then the phase curve is updated following the next adaptive sampled measurement, then the magnitude curve is further updated, then the phase curve is further updated, etc., until the magnitude and phase curves are learned.

In further detail, FIG. 7A illustrates a graph 180 having first, second, and third plots 182, 184, and 186 of the percentage of variance of the magnitude component of a surrogate model of the impedance of traction battery 24 as obtained by BECM 50 using the first, second, and third adaptive sampling algorithms, for iteratively learning the magnitude component plots, relative to high-density uniform sampling as a function of the number of measured samples of the impedance. Correspondingly, FIG. 7B illustrates a graph 190 having first, second, and third plots 192, 194, and 196 of the percentage of variance of the phase component of the surrogate model of the impedance of traction battery 24 as obtained by BECM 50 using the first, second, and third adaptive sampling algorithms, for iteratively learning the phase component plots, relative to high-density uniform sampling as a function of the number of measured samples of the impedance. FIG. 7C illustrates a graph 200 having first, second, and third plots 202, 204, and 206 of the measurement time expended to obtain the magnitude and phase components of the surrogate model of the impedance of traction battery 24 using the first, second, and third adaptive sampling algorithms as a function of the number of measured samples of the impedance. Graph 200 further includes a fourth plot 208 of the measurement time expended to obtain the magnitude and phase components of the impedance of traction battery 24 using the high-density uniform sampling.

As described, FIGS. 7A, 7B, and 7C pertain to frequencies for the magnitude and phase being sampled successively in an iterative fashion. In general, the results of iteratively learning the magnitude and phase curves per FIGS. 7A, 7B, and 7C are similar to the results of sequentially learning the magnitude and phase curves per FIGS. 6A, 6B, 6C, 6D, and 6E. For the iterative learning, the magnitude and phase curves of the impedance were learned, with respect to the 76-point high-density uniform sampling curve, to within $R^2>0.9999$ after about fifteen samples for all three adaptive sampling algorithms. The reduction in measurement time, shown in FIG. 7C, is about 2×-3× faster than the time expended for the 76-point high-density uniform sampling. Further time reductions may be possible as by optimizing the algorithms and leveraging relationships between the magnitude and phase components. Significant time reductions are also possible with a reduced frequency range of interest, especially reduced low-frequency conditions.

With adaptive sampling, it is possible to significantly decrease the time expended to acquire spectrally resolved EIS data to thereby enable on-board vehicle or charging station applications. This is beneficial because EIS does not require significant additional hardware in a vehicle, and it can make spatially distributed measurements in vehicles by leveraging voltage as the detection variable since voltage is resolved to the individual battery cell level.

As described herein, a traditional method to acquire EIS data is to measure across a high-density uniform grid that spans from low to high frequencies of interest. This can be time prohibitive. Therefore, as traction battery 24 state changes and thus the impedance of the traction battery changes, BECM 50 operating in accordance with the present disclosure attempts to minimize the number of measurements needed to fully resolve the complex impedance curves. In this way, a robust algorithmic way of achieving a desired result is provided and the number of sample points changes as the complexity of the curves increases or decreases.

While exemplary embodiments are described above, it is not intended that these embodiments describe all possible forms of the present disclosure. Rather, the words used in the specification are words of description rather than limitation, and it is understood that various changes may be made without departing from the spirit and scope of the present disclosure. Additionally, the features of various implementing embodiments may be combined to form further embodiments of the present disclosure.

What is claimed is:

1. A system comprising:
   a battery; and
   a controller configured to control the battery based on adaptive sampled electrochemical impedance spectroscopy measurements of the battery; and
   wherein each adaptive sampled electrochemical impedance spectroscopy measurement includes a magnitude component and a phase component, and the adaptive sampled electrochemical impedance spectroscopy measurements include electrochemical impedance spectroscopy measurements of the battery at frequencies within regions of a frequency range where a surrogate model of an impedance spectrum of the battery, generated from prior electrochemical impedance spectroscopy measurements of the battery at other frequencies within the frequency range, indicates that additional electrochemical impedance spectroscopy measurements are desired due to the surrogate model of the impedance spectrum of the battery providing a relatively poorer approximation of magnitude or phase components of the surrogate model of the impedance spectrum of the battery compared to other regions of the frequency range.

2. The system of claim 1 wherein:
   the controller is further configured to perform the adaptive sampled electrochemical impedance spectroscopy measurements.

3. The system of claim 2 wherein:
   the controller is further configured to perform the adaptive sampled electrochemical impedance spectroscopy measurements until the adaptive sampled electrochemical impedance spectroscopy measurements are indicative of the surrogate model of the impedance spectrum of the battery within a given tolerance.

4. The system of claim 2 wherein:
   the controller is configured to perform a first set of the adaptive sampled electrochemical impedance spectroscopy measurements to detect the magnitude components of the adaptive sampled electrochemical impedance spectroscopy measurements and to then perform a second set of the adaptive sampled electrochemical impedance spectroscopy measurements to detect the phase components of the adaptive sampled electrochemical impedance spectroscopy measurements.

5. The system of claim 2 wherein:
   the controller is configured to perform the adaptive sampled electrochemical impedance spectroscopy measurements to iteratively detect the magnitude and the phase components of the adaptive sampled electrochemical impedance spectroscopy measurements.

6. The system of claim 1 wherein:
   the controller is further configured to use the adaptive sampled electrochemical impedance spectroscopy measurements to identify values of parameters of a model of the battery.

7. The system of claim 6 wherein:
   the controller is further configured to use the model of the battery, with the identified values of the parameters, to detect an internal state of the battery whereby the controller detects the internal state of the battery based on the adaptive sampled electrochemical impedance spectroscopy measurements.

8. The system of claim 7 wherein:
   the internal state of the battery is a power capability of the battery whereby the controller controlling the battery based on the adaptive sampled electrochemical impedance spectroscopy measurements involves the controller controlling the battery based on the power capability of the battery.

9. The system of claim 7 wherein:
   the internal state of the battery is a state-of-charge of the battery whereby the controller controlling the battery based on the adaptive sampled electrochemical impedance spectroscopy measurements involves the controller controlling the battery based on the state-of-charge of the battery.

10. The system of claim 1 wherein:
    the battery is a traction battery.

11. The system of claim 1 wherein:
    the battery and the controller are on-board a vehicle.

12. The system of claim 1 wherein:
    the battery is on-board a vehicle, and the controller is off-board the vehicle.

13. A method for a vehicle having a traction battery and a controller, the method comprising:
    performing, by the controller, adaptive sampled electrochemical impedance spectroscopy measurements of the traction battery; and
    wherein each adaptive sampled electrochemical impedance spectroscopy measurement includes a magnitude component and a phase component, and wherein performing adaptive sampled electrochemical impedance spectroscopy measurements of the traction battery includes performing electrochemical impedance spectroscopy measurements of the traction battery at frequencies within regions of a frequency range where a surrogate model of an impedance spectrum of the traction battery, generated from prior electrochemical impedance spectroscopy measurements of the traction battery at other frequencies within the frequency range, indicates that additional electrochemical impedance spectroscopy measurements are desired due to the surrogate model of the impedance spectrum of the traction battery providing a relatively poorer approximation of magnitude or phase components of the surrogate model of the impedance spectrum of the battery compared to other regions of the frequency range; and
    controlling, with the controller, the traction battery and/or another component of the vehicle based on the adaptive sampled electrochemical impedance spectroscopy measurements of the traction battery.

14. The method of claim 13 further comprising:
    using the adaptive sampled electrochemical impedance spectroscopy measurements to identify values of parameters of a model of the traction battery; and
    detecting an internal state of the traction battery based on the model.

15. The method of claim 14 further comprising:
    detecting a distance-to-empty estimation of the vehicle based on the internal state of the traction battery; and
    controlling the traction battery and/or another vehicle component according to the distance-to-empty estimation of the vehicle.

16. A vehicle comprising:

a traction battery; and a controller configured to charge and/or discharge the traction battery based on adaptive sampled electrochemical impedance spectroscopy measurements of the traction battery; and wherein each adaptive sampled electrochemical impedance spectroscopy measurement includes a magnitude component and a phase component, and the adaptive sampled electrochemical impedance spectroscopy measurements include electrochemical impedance spectroscopy measurements of the traction battery at frequencies within regions of a frequency range where a surrogate model of an impedance spectrum of the traction battery, generated from prior electrochemical impedance spectroscopy measurements of the traction battery, indicates that additional electrochemical impedance spectroscopy measurements are desired due to the surrogate model of the impedance spectrum of the traction battery providing a relatively poorer approximation of magnitude or phase components of the surrogate model of the impedance spectrum of the traction battery compared to other regions of the frequency range.

17. The vehicle of claim 16 wherein:

the controller is further configured to perform the adaptive sampled electrochemical impedance spectroscopy measurements.

18. The vehicle of claim 16 wherein:

the controller is further configured to use the adaptive sampled electrochemical impedance spectroscopy measurements to identify values of parameters of a model of the traction battery.

19. The vehicle of claim 18 wherein:

the controller is further configured to use the model of the traction battery, with the identified values of the parameters, to detect an internal state of the traction battery whereby the controller detects the internal state of the traction battery based on the adaptive sampled electrochemical impedance spectroscopy measurements.

20. The vehicle of claim 16 wherein:

the vehicle is a battery electric vehicle.

* * * * *